United States Patent [19]

Kato et al.

[11] Patent Number: 5,494,862

[45] Date of Patent: Feb. 27, 1996

[54] METHOD OF MAKING SEMICONDUCTOR WAFERS

[75] Inventors: Tadahiro Kato; Masami Nakano; Sunao Shima; Hisashi Masumura, all of Nishigo, Japan

[73] Assignee: Shin-Etsu Handotai Co., Ltd., Tokyo, Japan

[21] Appl. No.: 250,503

[22] Filed: May 27, 1994

[30] Foreign Application Priority Data

Jun. 8, 1993 [JP] Japan .................................. 5-137763

[51] Int. Cl.$^6$ .................................................. H01L 21/304
[52] U.S. Cl. ..................... 437/249; 156/636.1; 156/651.1
[58] Field of Search ........................... 437/249; 156/636, 156/651, 662, 636.1, 651.1, 662.1

[56] References Cited

U.S. PATENT DOCUMENTS

| | | | |
|---|---|---|---|
| 4,276,114 | 6/1981 | Takano et al. | 437/946 |
| 4,343,662 | 8/1982 | Gay | 437/226 |
| 4,588,473 | 5/1986 | Hisatomi et al. | 156/636 |
| 5,227,339 | 7/1993 | Kishii | 437/249 |
| 5,320,706 | 6/1994 | Blackwell | 156/636 |

OTHER PUBLICATIONS

Basi, J., et al, "Controlled Wafer Backside Polishing", IBM Tech. Disc. Bull. vol. 21, No. 7, Dec. 1978, p. 2733.

*Primary Examiner*—George Fourson
*Attorney, Agent, or Firm*—Whitham, Curtis, Whitham & McGinn

[57] ABSTRACT

A method for a flatter semiconductor wafer free of ORP-observed irregularity and particles generated in handling on the back side of the wafer, in which an alkaline etching is adopted to utilize its advantage and a slight polishing step is combined to a conventional method of this kind. A deficiency of alkaline etching which brings about rougher surface irregularities on the surface of a wafer is eliminated by the use of the step of slight polishing on the back surface after the etching step and the inherent advantage stands without a loss, so that particle generation from the back surface of a semiconductor wafer in handling is much reduced and what's more a flatter semiconductor wafer is realized and a yield of an electronic device fabrication is increased.

6 Claims, 6 Drawing Sheets

MEASURING POSITION ON WAFER SURFACE (μm)

MEASURING POSITION ON WAFER SURFACE (μm)

5,494,862

METHOD OF MAKING SEMICONDUCTOR WAFERS

BACKGROUND OF THE INVENTION

1. Field of the Invention

The present invention relates to a method of making semiconductor wafers, and more particularly of making monocrystalline silicon wafers for use in fabrication of semiconductor devices.

2. Description of the Prior Art

In general, a method of making semiconductor wafers comprises the steps of slicing a monocrystalline ingot pulled in a monocrystalline ingot puller to obtain thin disk-shaped wafers; chamfering the wafer periphery to prevent cracks in and chipping off of the thus sliced wafer in the following step; lapping the chamfered wafer to flatten the surfaces; etching off the work damage retained in the lapped wafer; polishing the etched wafer across one of the surfaces; and cleaning the polished wafer to remove the residual of a polishing slurry and the other foreign substances on the wafer.

It is known that there are available an acid etching that uses an acid etching solution such as a mixed acid and an alkaline etching that uses an alkaline solution such as a sodium hydroxide solution as the etching treatment of the above mentioned etching.

In the acid etching, a higher etching rate is attained and there is observed a finer surface texture under 0.6 μm in roughness (the peak-to-valley height) and under 10 μm roughness spacing as shown in FIG. 4, whereas in the alkaline etching a lower etching rate is attained and there is observed a rougher surface texture as large as 10 to 20 μm in roughness spacing (and sometimes over 1.5 μm in the peak-to-valley height).

On the surface of the acid-etched wafer, a waviness (hereinafter referred to an ORP-observed irregularity) having a waviness spacing of 5 to 20 mm and the peak-to-valley height under 0.2 μm is produced, so that the flatness of such wafer is poor as shown in FIG. 6. On the other hand, on the surface of the alkaline etched wafer, none of the above described ORP-observed irregularity is produced and therefore the flatness of the wafer surface is kept during the etching in a rather good condition as shown in FIG. 6. In the FIG. 6 the ordinate axis in the rectangular coordinate system represents the local surface height measured with respect to a reference plane as the index of the flatness.

The ORP is the short for Optical Reflection Projector which is designed on the basis of the widely known Magic Mirror Principle or Magic Mirror Topography. Incident beams of light from a point source on a mirror-polished surface having a waviness are reflected back to an opposing imaging plane on which plane a variety of local illuminances are observed, a lighter portion corresponding to a recess on the waved mirror-polished surface.

A semiconductor wafer made by passing through the various steps above mentioned has the problems below described in the electronic device fabrication process where the semiconductor wafer is in use therefor, since the backside surface remains as it is etched.

The front surface does not cause any problem because after the wafer was etched, it is mirror-polished in the following polishing step and there is no need for holding it by suction on a stage in the electronic device fabrication process. But when the back surface acid-etched in the etching step is sucked to hold on a stage in the optical lithography step, the ORP-observed irregularity produced on the back surface is transferred on the front surface as it is, so that the ORP-observed irregularity reduces the resolving power of an exposure system, and thereby causes the yield of an electronic device fabrication therefrom to lower.

Furthermore, when the alkaline-etched back surface is sucked on a stage, particles are produced because sharp tips in the surface irregularity of a large surface roughness collapse by chipping off and that with a large number of the particles, resulting in the problem that the yield of an electronic device fabrication is reduced.

Shown in FIG. 7 are the numbers of particles being produced by holding on a stage by suction a variety of wafers that comprise those as finished by alkaline etching, acid etching and mirror-polishing respectively. The procedures or principle of the counting the number of the produced particles is described here. First of all, a reference polished wafer is counted across the polished surface as regards particles larger than 0.1 μm across; then the reference is superposed on a sample wafer, the reference side down, where the measuring surface of the sample is posed to face upward, next the reference wafer is pushed downward to press the sample at a pressure of 1 Kgf/cm$^2$ for 1 min for example, and lastly the reference wafer is removed to be ready for measurement of transferred particles on its reference side. The reference wafer is again counted in the same way as for the first time and the increase of the particle count across the surface is evaluated as "Number of Particles".

An alkaline-etched wafer is counted 4000~5000 particles and an acid-etched wafer about 2000 particles while a wafer as finished by both-sided polishing shows almost no particles produced through the above mentioned procedures.

Consequently, with a wafer as finished by both-sided polishing, particle generation in handling the wafer is suppressed because of the absence of large surface irregularities on the back surface and what's more, a better flatness is achieved due to no existence of ORP-observed irregularity, so that the above-mentioned problems are solved.

According to the above mentioned both-sided polishing, however, the disadvantages entail that the wafer detecting sensor that is generally accepted and which is designed to detect wafers by detecting the reflected light does not work on the back side as well as a second polishing step is added to increase the cost the more.

SUMMARY OF THE INVENTION

The present invention was made in view of the above problems, and it is, therefore, an object of the invention to provide a method of making semiconductor wafers which can prevent occurrence of particles by chipping off on the back surface and thereby can realize a better yield of electronic device fabrication as well as detect existence of a wafer or difference between the front and back of the wafer, only by adding a slight back side polishing step and not doubling the entire mirror-polishing step calling for precise control.

In order to achieve this object, according to the present invention, a method of the kind mentioned in the opening paragraph which comprises the steps of slicing a monocrystalline ingot pulled in a monocrystalline ingot puller to obtain thin disk-shaped wafers; chamfering the wafer periphery to prevent cracks in and chipping off of the thus sliced wafer in the following step; lapping the chamfered wafer to flatten the surface; etching off the work damage retained in the wafer that is already chamfered and then lapped; polishing the etched wafer across one of the surfaces; and cleaning the polished wafer to remove the residual of a polishing slurry and the other foreign substances on the wafer, is modified in a manner such that an alkaline etching is adopted in the above mentioned etching step and further a back side polishing step is combined between said etching step and the above mentioned front polishing step, said back side polishing step having the purpose of partly removing the surface irregularities formed on the back side during the above mentioned alkaline etching.

The alkaline etching solution is an aqueous solution of sodium hydroxide or potassium hydroxide.

According to the present invention, another object, that is, to improve the flatness of a wafer by eliminating ORP-observed irregularity and thereby to obtain a higher yield of electronic device fabrication is accomplished by adopting an alkaline etching in the etching step in view of the intrinsic advantage of an alkaline etching.

A defective point of an alkaline etching, that is, to bring about surface irregularities with a larger peak-to-valley height is deleted by following removal in part of the surface irregularities in the back side polishing step and therefore, chipping off on the back surface is suppressed enough to prevent particles from occurring thereon, for example, in the optical lithography step of an electronic device fabrication process, so that a further higher yield of electronic device fabrication is realized.

Furthermore, a wafer does not need to be mirror-polished on both sides under precise control and, only a slight polishing is applied to the back surface in the back side polishing step and consequently, detection of the difference between the front and back of a wafer is made possible by means of the wafer detecting sensor on the basis of a differential between the surfaces in glossiness, where the glossiness of the back surface is kept lower than that of the front surface, as well as time saving is achieved by eliminating the perfect both-sided polishing during the application of the method of making semiconductor wafers according to the present invention. The glossiness above mentioned is a ratio of reflected light to incident light in energy on a measuring surface (e.g. reflectivity).

DETAILED DESCRIPTION OF THE PREFERRED EMBODIMENT

Below illustrated is an embodiment according to the present invention, referring to the accompanying drawings.

Figure 1:
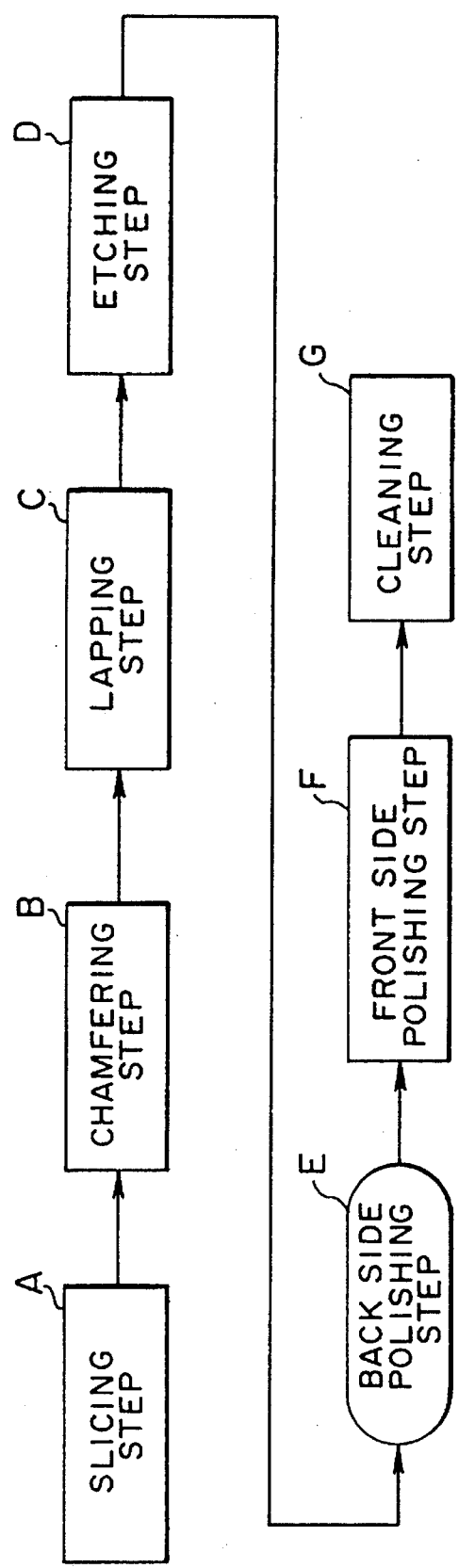
FIG. 1 is a block diagram showing the steps of a method of making semiconductor wafers according to the present invention in the order of application thereof.

Referring first of all to FIG. 1, a method of making semiconductor wafers in accordance with the present invention is explained following the order of application of the steps.

First of all, in the slicing step A, a pulled monocrystalline ingot, which was pulled by a monocrystalline ingot puller (not shown), is sliced along the plane perpendicular to the rod axis of the ingot or at an angle therebetween so as to be obtained a plurality of thin disk-shaped wafers.

A wafer obtained in the above mentioned slicing step A is next chamfered along the periphery in the following chamfering step B, in succession the thus chamfered wafer is lapped to be flat by a lapping machine (not shown) in the lapping step.

Figure 5:
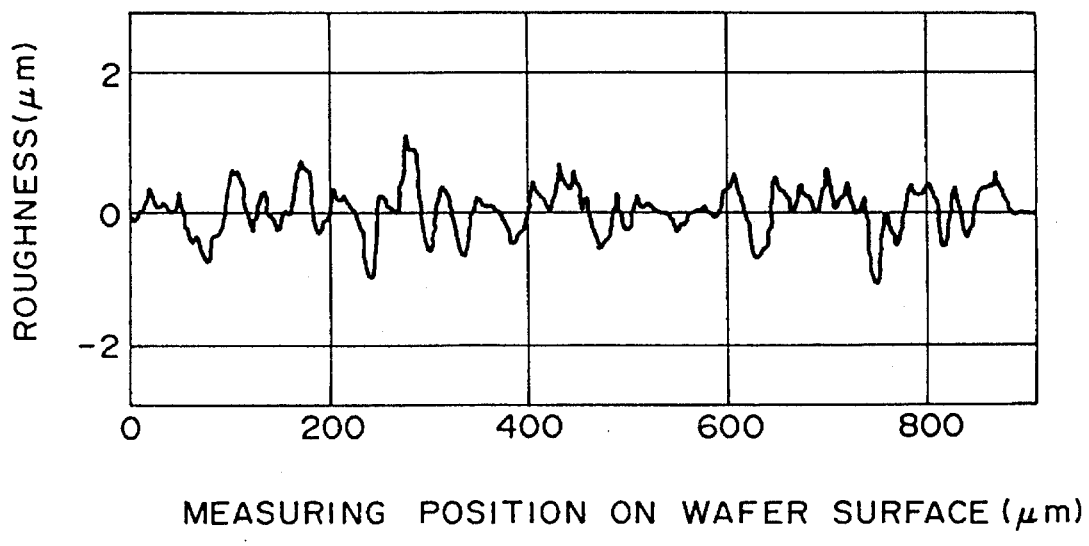
FIG. 5 is a graph depecting the measured surface profile of an alkaline etchrd wafer.
Figure 6:
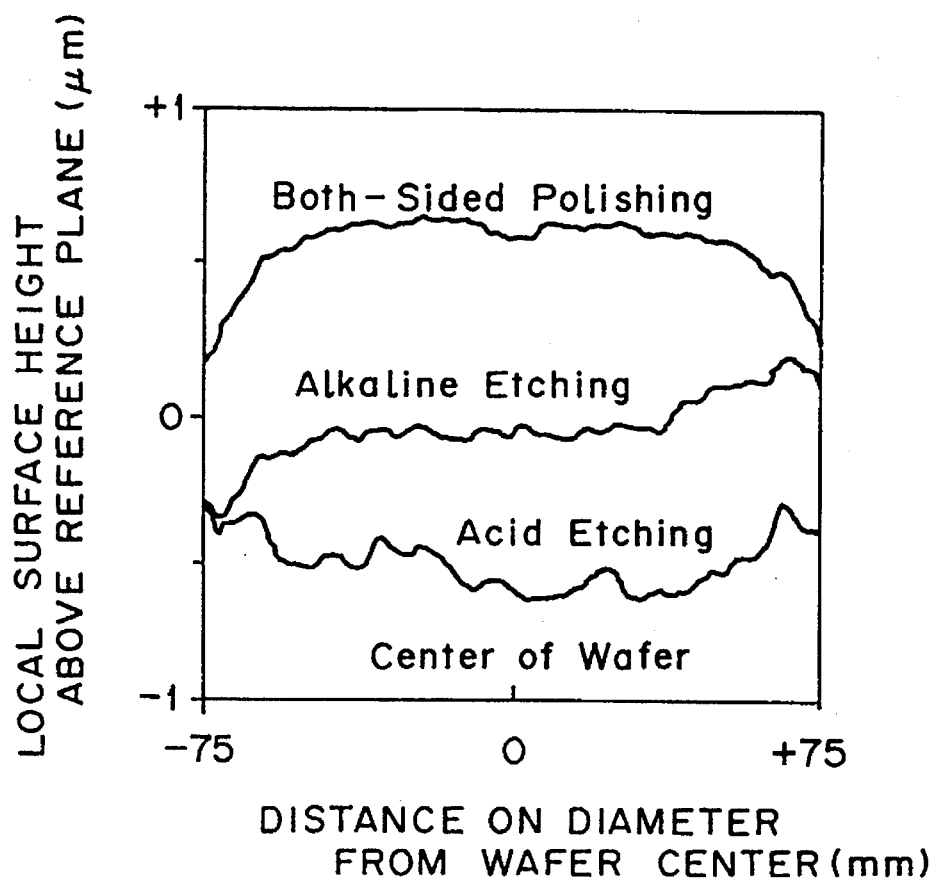
FIG. 6 is a graph depicting the flatness each of the surfaces as finished by a both-sided polishing, an alkaline etching and an acid-etching respectively.
Figure 7:
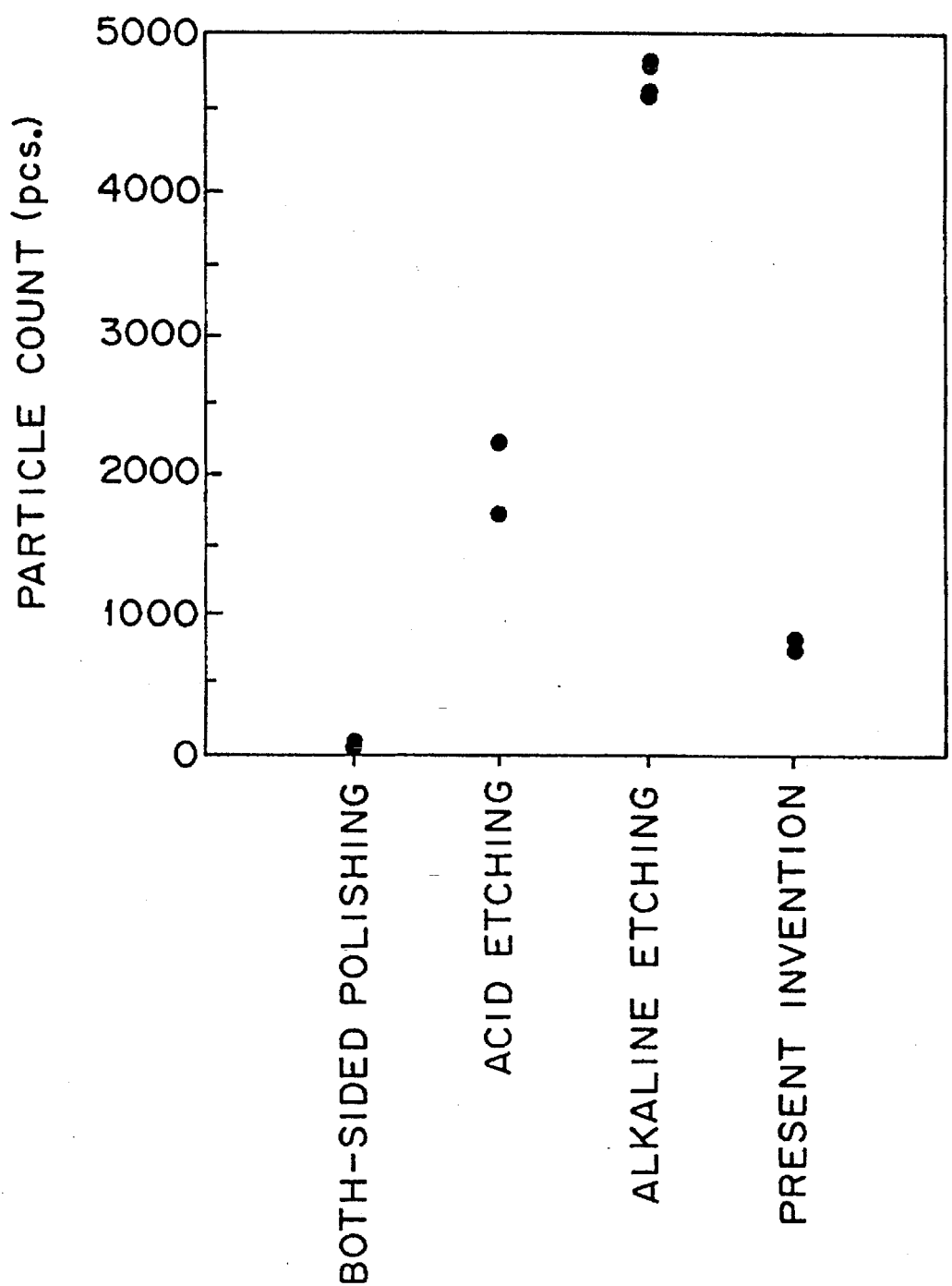
FIG. 7 is a graph depicting the number of particles each vs various surface finishes of wafers.

Next, the thus flattened wafer is etched off in the surface region accumulating the work damage therein by an alkaline etching, for example, an aqueous solution of 45% sodium hydroxide (by weight) in the etching step D. On this occasion, on the both surfaces of the wafer observed are surface irregularities with a roughness sometimes as large as to top the peak-to-valley height of 1.5 μm and the roughness spacing of 10 to 20 μm shown in FIG. 5. On the surface as alkaline-etched there is no sign of ORP-observed irregularity peculiar to the acid etching. The flatness of the surface thus achieved in the lapping step is retained during the etching step as shown in FIG. 6 in a fairly good condition though within a tolerance.

In the mean time, according to an conventional technology a wafer which work damage is etched off by an acid-etching is polished only on one of the surfaces as etched in the front side polishing step and accordingly the surface irregularities generated on the surfaces by etching are retained on the back surface as it is generated up to the last stage of a method of making semiconductor wafers, so that the technical problem above mentioned have been encountered.

In view of the technical problems, the backside polishing step E is added between the etching step D and the front side polishing F as illustrated in the foregoing description.

Figure 2:
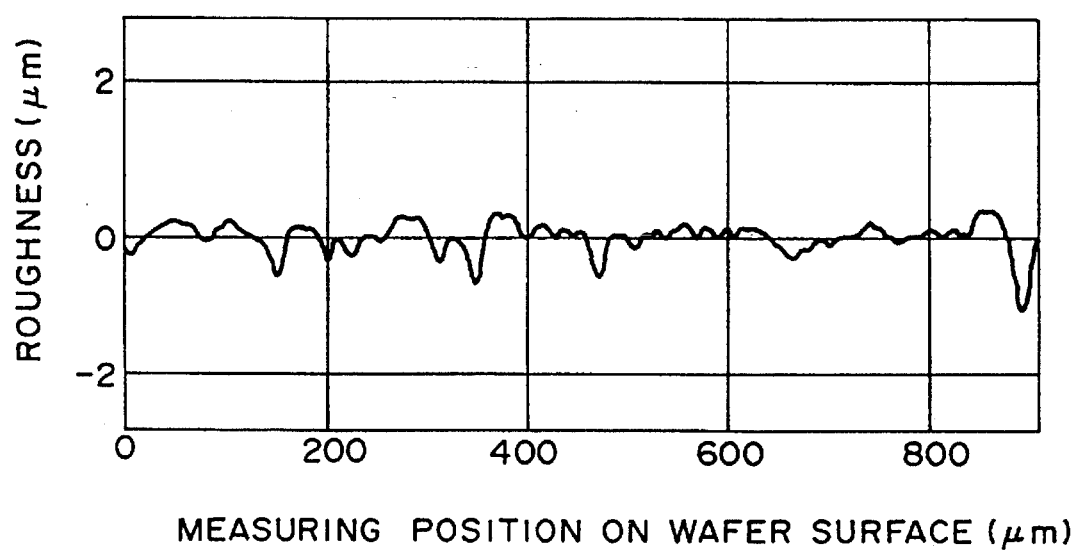
FIG. 2 is a graph depicting the measured surface profile of the back side of an alkaline-etched wafer after the back-side polishing.

The back side polishing step E is a step to eliminate in part the above mentioned surface irregularities with a large roughness formed on the back surface by an alkaline etching in the etching step. The surface irregularities of the back surface are reduced as shown in FIG. 2.

Further, in the back side polishing, the stock removal is limited to the minimal amount with which the generation of particles is suppressed and the optical detection of side difference between the front surface and back surface of a wafer is possible to carry out by a wafer detecting sensor sensing the glossiness of the back surface. Therefore, a polishing under a lower pressure is applied on the back surface to remove the stock under 3.0 μm in depth.

Figure 3:
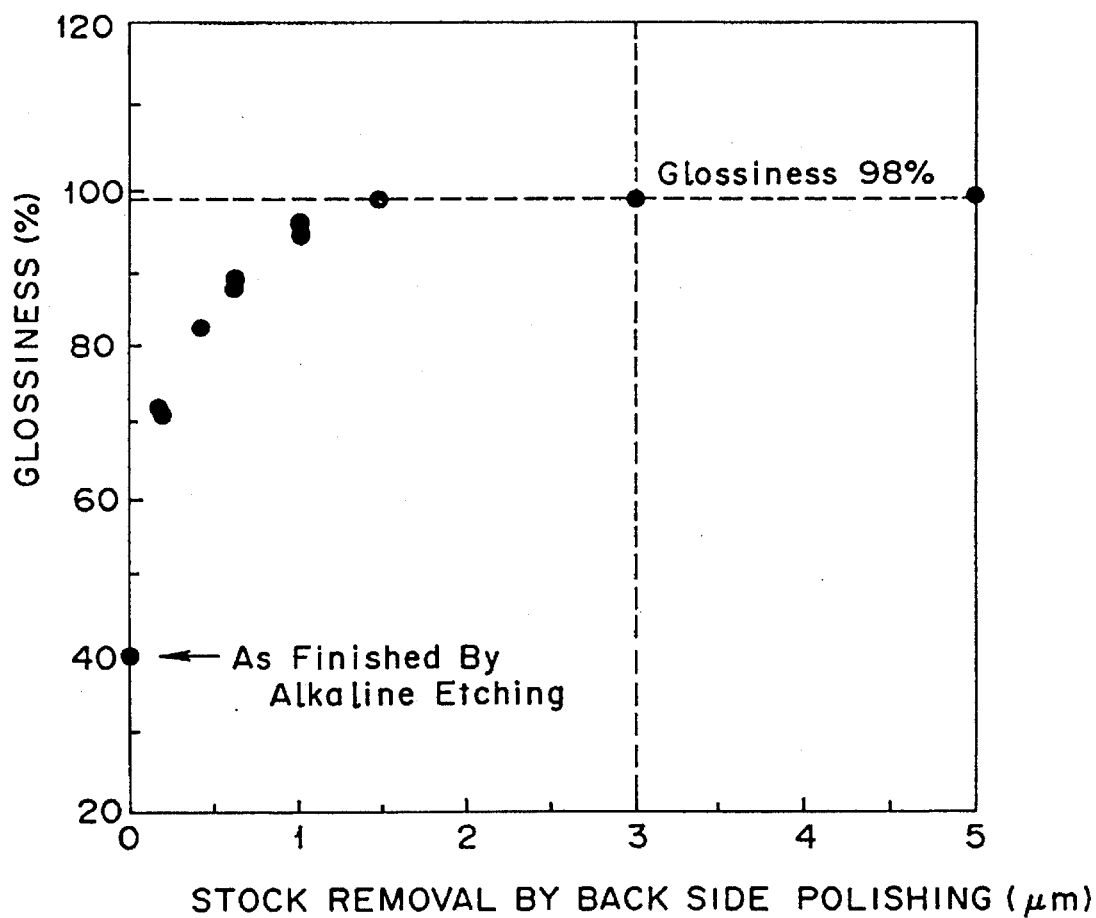
FIG. 3 is a graph depicting the glossiness of the wafer back surface vs. the stock removal by the back side polishing.
Figure 4:
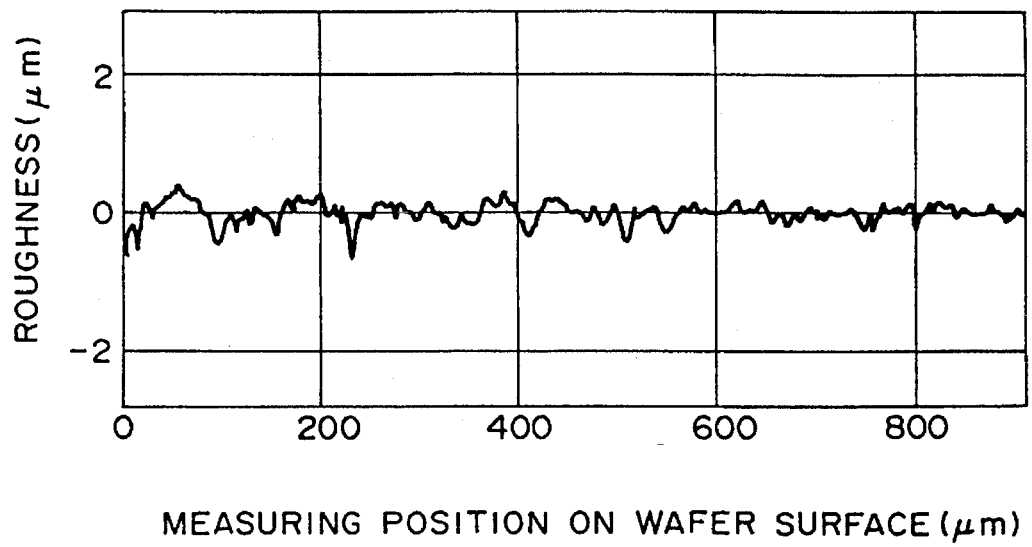
FIG. 4 is a graph depicting the measured surface profile of an acid-etched wafer.

Now, a dependency of the glossiness on the stock removal for an alkaline-etched wafer is shown in FIG. 3. The stock removal should be restricted under 3.0 μm on the back surface in the back side polishing step in view of the maximal glossiness or reflectivity of 98% enabling to distinguish between the front surface and the back surface.

After part of the surface irregularities was removed on the back surface in the above-mentioned back side polishing, the front surface is then polished by the use of a polishing machine(not shown) and a polishing slurry and in the following cleaning step particles and residual of the polishing slurry are deleted from the surface by cleaning.

Above described are a series of the steps for a method of making semiconductor wafers according to the instant embodiment. In this embodiment a wafer is alkaline-etched in the etching step D as mentioned above and is thereby improved in the flatness because of lack of ORP-observed irregularity, where the advantage inherent to alkaline etching is materialized without a loss. The improvement on the flatness makes higher the resolving power in an exposure system employed in an optical lithography step of an electronic device fabrication process and a higher yield thereof realized as well.

And a deficiency of an alkaline etching, that is, to produce surface irregularities with a larger roughness on the back side of the wafer is settled to disappear. For instance, when a wafer is sucked on the back surface thereof in an optical lithography step of an electronic device fabrication process, generation of particles by chipping off part of the surface irregularities is suppressed. According to the present invention, the number of the particles is lowered down to as low as 700 to 800 particles.

Further, there is no need for the perfect both-sided polishing and the back surface of a wafer is only slightly polished instead and as a result, time saving is attained according to adoption of the slight polishing instead of the full polishing on the back side surface. Still further, difference between the front surface and the back surface can be optically sensed to detect on the basis of the glossiness measurement.

What is claimed is:

1. A method of making a semiconductor wafer comprising the steps, in sequence, of:

slicing a monocrystalline semiconductor ingot to obtain at least one semiconductor wafer, chamfering a periphery of said wafer, flattening surfaces of said wafer by lapping, etching surfaces of said wafer in an alkaline etching solution, partly removing surface irregularities on a first surface of said wafer by removing less than 3.0 µm of a portion of wafer surface by a polishing process, polishing a second surface of said wafer to be mirror-polished, and cleaning said wafer.

2. A method of making a semiconductor wafer comprising the steps, in sequence, of:

slicing a monocrystalline semiconductor ingot to obtain at least one semiconductor wafer, chamfering a periphery of said wafer, flattening surfaces of said wafer by lapping, etching surfaces of said wafer in an alkaline etching solution such that the peak-to-valley height of surfaces of said wafer is less the 1.5 µm, partly removing surface irregularities on a first surface of said wafer by a polishing process, polishing a second surface of said wafer to be mirror-polished, and cleaning said wafer.

3. A method as recited in claim 1, wherein reflectivity achieved by said step of partly removing surface irregularities is equal to or less than 98% of reflectivity achieved by said mirror polishing step.

4. A method according to claim 1, wherein the alkaline etching is performed by the use of an aqueous solution of sodium hydroxide or an aqueous solution of potassium hydroxide as an etching solution in the etching step.

5. A method according to claim 4, wherein the aqueous solution of sodium hydroxide is at a concentration of 45% by weight.

6. A method according to claim 4, wherein the surface of the wafer is finished by the alkaline etching step to a surface roughness having a peak-to-valley height of under 1.5 µm.

* * * * *